(12) United States Patent
van Ngo et al.

(10) Patent No.: US 6,989,601 B1
(45) Date of Patent: Jan. 24, 2006

(54) COPPER DAMASCENE WITH LOW-K CAPPING LAYER AND IMPROVED ELECTROMIGRATION RELIABILITY

(75) Inventors: Minh van Ngo, Fremont, CA (US); Jeremy I. Martin, Austin, TX (US); Hartmut Ruelke, Wilschdorf (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/946,071

(22) Filed: Sep. 22, 2004

Related U.S. Application Data

(62) Division of application No. 10/097,965, filed on Mar. 15, 2002, now Pat. No. 6,797,652.

(51) Int. Cl.
*H01L 23/48* (2006.01)

(52) U.S. Cl. ................. 257/762; 257/750; 257/758

(58) Field of Classification Search ............... 257/750, 257/758, 762, 701, 702, 703; 438/85, 104, 438/687
See application file for complete search history.

(56) References Cited

U.S. PATENT DOCUMENTS

| 5,447,887 | A | | 9/1995 | Filipiak et al. |
|---|---|---|---|---|
| 6,136,680 | A | | 10/2000 | Lai et al. |
| 6,147,009 | A | | 11/2000 | Grill et al. |
| 6,156,642 | A | * | 12/2000 | Wu et al. .................. 438/637 |
| 6,255,217 | B1 | | 7/2001 | Agnello et al. |
| 6,355,571 | B1 | | 3/2002 | Huang et al. |
| 6,365,527 | B1 | | 4/2002 | Yang et al. |
| 6,383,925 | B1 | | 5/2002 | Ngo et al. |
| 6,429,128 | B1 | | 8/2002 | Besser et al. |
| 6,432,822 | B1 | | 8/2002 | Ngo et al. |
| 6,444,568 | B1 | | 9/2002 | Sundararajan et al. |
| 6,593,653 | B2 | | 7/2003 | Sundararajan et al. |
| 6,689,684 | B1 | * | 2/2004 | You et al. .................. 438/639 |
| 6,713,874 | B1 | * | 3/2004 | Hopper et al. ............. 257/760 |
| 6,756,672 | B1 | * | 6/2004 | You et al. .................. 257/751 |

* cited by examiner

*Primary Examiner*—Jasmine Clark

(57) ABSTRACT

The electromigration resistance of Cu lines is significantly improved by depositing a low-k capping layer thereon, e.g., a silicon carbide capping layer having a dielectric constant of about 4.5 to about 5.5. Embodiments include sequentially treating the exposed planarized surface of inlaid Cu with a plasma containing $NH_3$ diluted with $N_2$, discontinuing the plasma and flow of $NH_3$ and $N_2$, pumping out the chamber; introducing trimethylsilane, $NH_3$ and He, initiating PECVD to deposit the silicon carbide capping layer, as at a thickness of about 200 Å to about 800 Å. Embodiments also include Cu dual damascene structures formed in dielectric material having a dielectric constant (k) less than about 3.9.

8 Claims, 3 Drawing Sheets

COPPER DAMASCENE WITH LOW-K CAPPING LAYER AND IMPROVED ELECTROMIGRATION RELIABILITY

This application is a Divisional of Ser. No. 10/097,965 filed on Mar. 15, 2002 now U.S. Pat. No. 6,797,652.

FIELD OF THE INVENTION

The present invention relates to copper (Cu) and/or Cu alloy metallization in semiconductor devices, particularly to a method for forming reliably capped Cu or Cu alloy interconnects, such as single and dual damascene structures formed in low dielectric constant materials. The present invention is particularly applicable to high speed integrated circuits having submicron design features and high conductivity interconnects with improved electromigration resistance.

BACKGROUND ART

The escalating requirements for high density and performance associated with ultra large scale integration semiconductor wiring require responsive changes in interconnection technology. Such escalating requirements have been found difficult to satisfy in terms of providing a low RxC (resistance×capacitance) interconnect pattern with electromigration resistance, particularly wherein submicron vias, contacts and trenches have high aspect ratios imposed by miniaturization.

Conventional semiconductor devices comprise a semiconductor substrate, typically doped monocrystal line silicon, and a plurality of interleaved sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filing a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization have become more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, e.g., a metal. Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RxC delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

There are additional problems attendant upon conventional Cu interconnect methodology employing a diffusion barrier layer (capping layer). For example, conventional practices comprise forming a damascene opening in an interlayer dielectric, depositing a barrier layer, such as TaN, lining the opening and on the surface of the interlayer dielectric, filling the opening with Cu or a Cu alloy layer, CMP, and forming a capping layer on the exposed surface of the Cu or Cu alloy. It was found, however, that capping layers, such as silicon nitride, deposited by plasma enhanced chemical vapor deposition (PECVD), exhibit poor adhesion to the Cu or Cu alloy surface. Consequently, the capping layer is vulnerable to removal, as by peeling due to stresses resulting from subsequent deposition of layers. As a result, the Cu or Cu alloy is not entirely encapsulated and Cu diffusion occurs, thereby adversely affecting device performance and decreasing the electromigration resistance of the Cu or Cu alloy interconnect member. The poor adhesion of a silicon nitride capping layer to inlaid Cu or a Cu alloy can be alleviated by plasma treatment, as with a plasma containing ammonia ($NH_3$) and nitrogen ($N_2$), with varying effects on electromigration performance. As device geometries plunge deeper into the sub-micron regime, electromigration becomes increasingly problematic. In addition, the high dielectric constant, i.e., a dielectric constant (k) of about 7.2 to about 8.2, e.g., about 7.5, of silicon nitride adversely impacts control speed.

Accordingly, there exists a continuing need for methodology enabling the formation of encapsulated Cu and Cu alloy interconnects for vertical metallization levels with greater accuracy, reliability, control speed and electromigration resistance. There exists a particular continuing need for methodology enabling the formation of capped Cu or Cu alloy lines, particularly in damascene structures, e.g., dual damascene structures formed in dielectric material having a low dielectric constant (k), with improved capping layer adhesion and improved reliability, control speed, and electromigration resistance, particularly along the Cu/capping layer interface.

DISCLOSURE OF THE INVENTION

An advantage of the present invention is a method of manufacturing a semiconductor device having highly reliable capped Cu or Cu alloy interconnects.

Another advantage of the present invention is a method of manufacturing a semiconductor device comprising a capped Cu or Cu alloy interconnect member with improved capping layer adhesion and improved electromigration resistance.

A further advantage of the present invention is a semiconductor device comprising Cu or Cu interconnects with improved electromigration reliability.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: introducing a wafer containing inlaid copper (Cu) or a Cu alloy into a chamber; treating an exposed surface of the Cu or Cu alloy with a plasma containing ammonia ($NH_3$) and nitrogen ($N_2$) to remove oxide therefrom; and depositing a silicon carbide capping layer, having a dielectric constant (k) of about 4.5 to about 5.5, on the treated Cu or Cu alloy surface by plasma enhanced chemical vapor deposition (PECVD).

Embodiments of the present invention comprise treating the exposed Cu surface with the plasma employing an $NH_3$ flow rate of about 180 to about 380 sccm, an $N_2$ flow rate of about 8,000 to about 9,200 sccm, at a temperature of about 300° C. to about 400° C., pressure of about 3.2 to about 5.2 Torr, RF power of about 100 to about 300 watts, for about 10 to about 60 seconds. Subsequently, the power and $NH_3$ and $N_2$ flow rates are discontinued. The chamber is then pumped out, as for a period of about 2 seconds to about 32 seconds, e.g., about 15 seconds. After pumping out the chamber, trimethylsilane (TMS), $NH_3$ and He are introduced and PECVD initiated to deposit the silicon carbide capping layer at a suitable thickness, e.g., from about 200 Å to about 800 Å. PECVD of the silicon carbide capping layer can be implemented employing a TMS flow rate of about 60 to about 260 sccm, $NH_3$ flow rate of about 225 to about 425 sccm, He flow rate from about 100 to about 700, at a temperature of about 300° C. to about 400° C., pressure of about 2 to about 5 Torr and RF power of about 100 to about 500 watts, for about 10 seconds to about 30 seconds.

Another aspect of the present invention is a semiconductor device comprising copper (Cu) or a Cu alloy inlaid in a dielectric layer with a silicon carbon capping layer thereon, the silicon carbide capping layer having a dielectric constant (k) of about 4.5 to about 5.5.

Embodiments of the present invention further include single and dual damascene techniques comprising forming an opening in an interlayer dielectric on a wafer, depositing an underlying diffusion barrier layer, such as Ta and/or TaN, lining the opening and on the interdielectric layer, depositing a seedlayer, depositing the Cu or Cu alloy layer on the diffusion barrier layer filling the opening and over the interlayer dielectric, removing any portion of the Cu or Cu alloy layer beyond the opening by CMP, leaving an exposed surface oxidized, and conveying the wafer into the deposition chamber for processing in accordance with embodiments of the present invention by treating the exposed surface of the Cu or Cu alloy layer with the $NH_3/N_2$ plasma employing a relatively low $NH_3$ flow rate and a relatively high $N_2$ flow rate, discontinuing plasma treatment, pumping out the chamber and then depositing the low-k silicon carbide capping layer on the treatment surface by PECVD.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
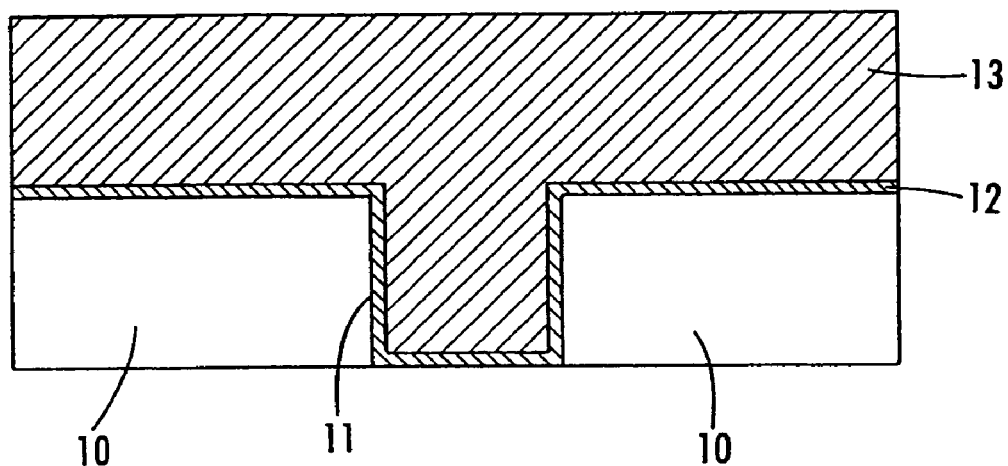
FIGS. 1 through 4 schematically illustrate sequential phases of a method in accordance with an embodiment of the present invention.

The present invention addresses and solves problems attendant upon forming capped Cu interconnects by providing methodology enabling improved adhesion of a capping layer, increased control speed, a significant improvement in electromigration resistance, particularly at the Cu/capping layer interface, and a significant improvement in within wafer and wafer-to-wafer uniformity. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0.12 micron and under, the electromigration resistance of encapsulated Cu interconnect members becomes increasingly significant. It was found that conventional practices in forming a Cu interconnect member in a damascene opening, e.g., a dual damascene opening, result in the formation of a thin copper oxide surface film, believed to comprise a mixture of CuO and $Cu_2O$ formed during CMP. The thin copper oxide surface film layer is porous and brittle in nature. The presence of such a thin copper oxide surface film undesirably reduces the adhesion of a capping layer, such as silicon nitride, to the underlying Cu interconnect member. Consequently, cracks are generated at the Cu copper oxide interface, resulting in copper diffusion and increased electromigration as a result of such diffusion. The cracks occurring in the Cu copper oxide interface enhance surface diffusion, which is more rapid than grain boundary diffusion or lattice diffusion.

The present invention not only addresses and solves the capping layer adhesion problem but, further, improves overall control speed by reducing the RxC constant and, significantly, reducing electromigration failures. These objectives are achieved in accordance with embodiments of the present invention by treating the exposed Cu surface with a plasma containing $NH_3$ heavily diluted with $N_2$, discontinuing plasma treatment, and then pumping out the chamber. Subsequently, a silicon carbide capping layer is deposited by PECVD. Significantly, the PECVD silicon carbide capping layer exhibits a low dielectric constant (k) of about 4.5 to about 5.5 vis-à-vis the typical dielectric constant for silicon nitride, i.e., about 7.2 to about 8.2. Electromigration performance evaluated on inlaid Cu having a 500 Å silicon carbide capping layer was found to be significantly improved.

The exact mechanism underlying the significant improvement in electromigration resistance attendant upon implementing embodiments of the present invention is not known with certainty. However, it was found that plasma treatment of the exposed copper surface with $NH_3/N_2$ plasma, heavily diluted with $N_2$, followed by discontinuing the plasma, discontinuing introduction of $NH_3$ and $N_2$, and pumping out the chamber, as to a based pressure of 10 to 30 milliTorr, prior to initialing PECVD to deposit the silicon carbide capping layer, yielded dramatic improvements in electromigration resistance.

Embodiments of the present invention comprise introducing inlaid Cu, e.g., a single or dual damascene structure formed in a low-k dielectric layer, into a chamber and plasma treating the exposed Cu surface as by employing an $NH_3$ flow rate of about 180 to about 380 sccm, $N_2$ flow rate of about 8,000 to about 9,200 sccm, temperature of about 300° C. to about 400° C., e.g., about 350° C., RF power of about 100 to about 300 watts, e.g., about 200 watts, and a pressure of about 3.2 to about 5.2 Torr e.g., about 4.2 Torr, for about 10 seconds to about 60 seconds, e.g., about 40 seconds. After plasma treating the Cu surface, the plasma is discontinued, and the introduction of $NH_3$ and $N_2$ discontinued. The chamber is then pumped out, as for about 2 seconds to about 32 seconds, e.g., about 15 seconds, to a based pressure of about 10 to about 30 milliTorr. After pumping out the chamber, TMS, $NH_3$ and He are introduced and a plasma is started to initiate PECVD of the silicon carbide capping layer. PECVD of the silicon carbide capping layer can be effected employing a TMS flow rate of about 60 to about 260 sccm, $NH_3$ flow rate of about 225 to about 425 sccm. He flow rate of about 100 to about 700 sccm, temperature of about 300° C. to about 400° C., e.g., about 350° C., pressure of about 2 to about 5 Torr, e.g., from about 3 Torr, RF power of about 100 to about 300 watts, e.g., about 280 to about 320 watts, for about 10 to about 30 seconds, e.g., about 20 seconds, to deposit the silicon carbide capping layer at a thickness of about 200 Å to about 800 Å, e.g., about 500 Å. The resulting structure exhibits significantly improved electromigration performance.

Improved electromigration resistance of capped Cu interconnects formed in accordance with embodiments of the present invention was confirmed by lognormal sigma measurements. Lognormal sigma is a measure of spread in electromigration (EM) data (failure times). Higher signma leads to a lower projected EM lifetime at use conditions. The product EM lifetime is calculated by the following eqn: Lifetime=T50% exp(-N*sigma) where T50% is Median time to fail (MTTF) and N=6 for T0.1% failure rate and product factor of about $10^6$. Therefore, higher values of sigma could cause a significant degradation in projected lifetime due to the exponential dependence. The inventive process flow disclosed herein not only improves T50% but also give a tight sigma, which leads to higher projected DM lifetime.

Cu interconnects formed in accordance with embodiments of the present invention can be, but are not limited to, interconnects formed by dam ascene technology. Thus, embodiments of the present invention include forming an interlayer dielectric overlying a substrate, forming an opening, e.g., a damascene opening, in the interlayer dielectric, depositing a diffusion barrier layer, such as Ta and/or TaN, and filling the opening with Cu. Advantageously, the opening in the interlayer dielectric can be filled by initially depositing a seedlayer and then electroplating or electrolessly plating the Cu. Typical seedlayers include Cu alloys containing magnesium, aluminum, zinc, zirconium, tin, nickel, palladium, silver or gold in a suitable amount, e.g., about 0.3 to about 12 at. %. CMP is then performed such that the upper surface of the inlaid Cu is substantially coplanar with the upper surface of the interlayer dielectric. As a result of CMP, a thin film of copper oxide is typically formed. The exposed oxidized surface of the Cu is then processed by plasma treatment in $NH_3/N_2$, discontinuing plasma treatment pumping out the chamber and then initiating PECVD of the silicon carbide capping layer in accordance with an embodiment of the present invention.

In accordance with embodiments of the present invention, the damascene opening can also be filled with Cu by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron-and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEDS) and fluorine-doped silicate glass (FSG).

An embodiment of the present invention is schematically illustrated in FIGS. 1 through 4, wherein similar reference numerals denote similar elements or features. Adverting FIG. 1, damascene opening 11, such as a contact or via hole, or trench, is formed in dielectric layer 10, e.g., a low-k material. It should be understood that opening 11 can also be formed as a dual damascene opening comprising a contact or via hole section in communication with a trench section. A barrier layer 12 is deposited, such as Ta and/or TaN, and Cu layer 13 is then deposited. Upon electroplating or electroless plating layer 13, a seedlayer (not shown) is deposited on barrier layer 12.

Figure 2:
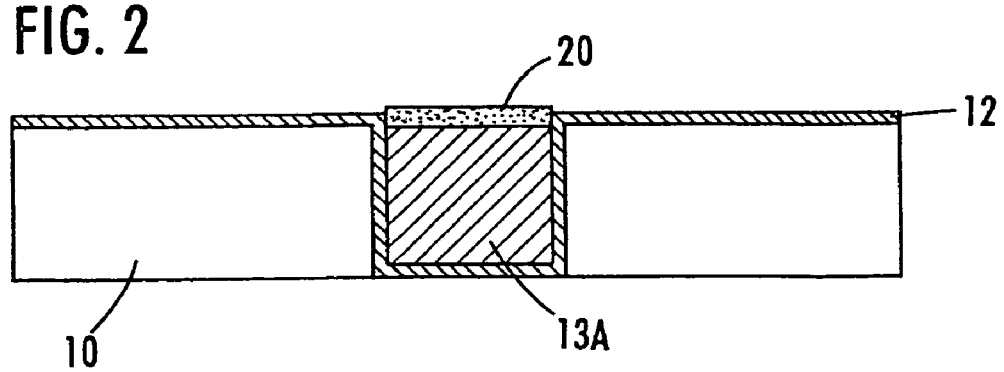

Adverting to FIG. 2, the portions of the Cu alloy layer 15 extending beyond opening 11 are removed, as by CMP. As a result, a thin film of copper oxide 20 is formed on the exposed surface of the Cu interconnect member 13A. The wafer containing the Cu metallization is then introduced into a chamber and processed in accordance with embodiments of the present invention.

Figure 3:
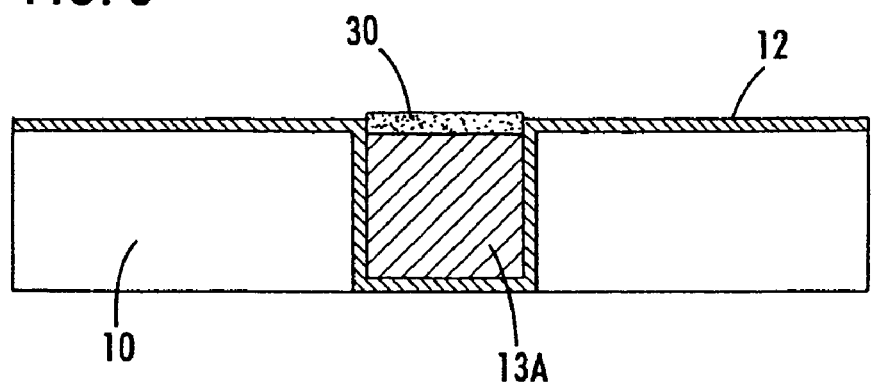
Figure 4:
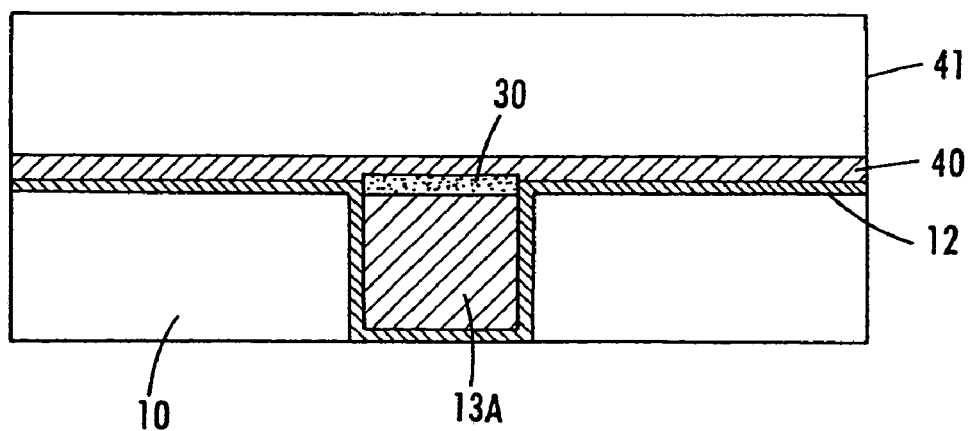

Adverting to FIG. 3, in accordance with embodiments of the present invention, the exposed surface of the Cu interconnect member 13A having a thin copper oxide film 20 thereon is treated with a soft plasma at a relatively low $NH_3$ flow rate and a relatively high $N_2$ flow rate to remove or substantially reduce the thin copper oxide film 20 leaving a clean, Cu surface 30. After plasma treatment, the power is turned off and introduction of $NH_3$ and $N_2$ discontinued. The chamber is then pumped out. Subsequently, TMS, $NH_3$ and He are introduced and a plasma is generated to deposit the silicon carbide capping layer 40, as shown in FIG. 4, by PECVD. Advantageously, the silicon carbide capping layer 40 exhibits a low dielectric constant of 5.0. Another interlayer dielectric 41 is then deposited, such as a low-k material. In this way, a plurality of interlayer dielectrics and metallization patterns are built up on a semiconductor substrate and various interconnects are formed.

Figure 5:
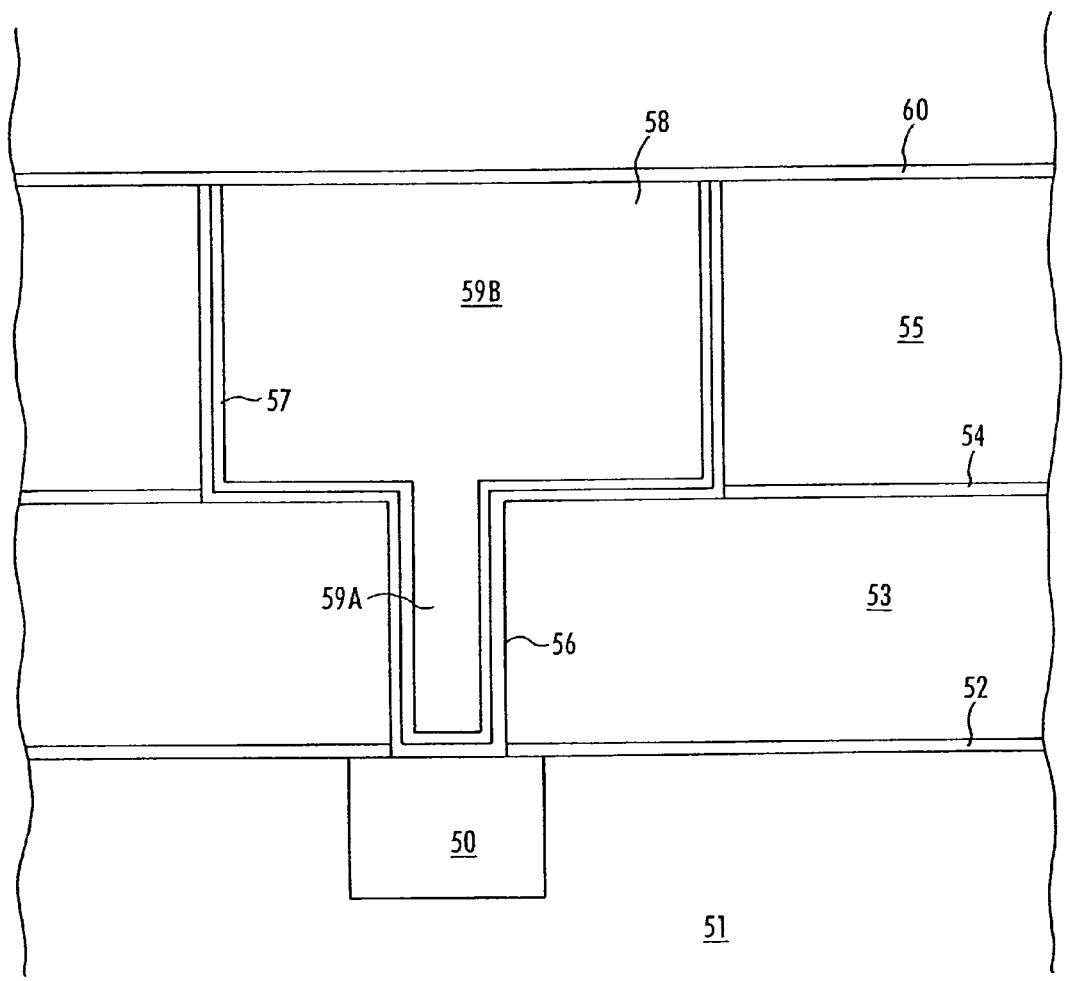
FIG. 5 schematically illustrates a dual damascene structure in accordance with an embodiment of the present invention.

A dual damascene embodiment of the present invention in schematically illustrated in FIG. 5 and comprises a lower conductive feature, such as a metal line, e.g., a Cu line, formed in dielectric layer 51 overlying a substrate or wafer (not shown). Dielectric layer of 51 can comprise any conventional dielectric material, particularly a low-k material. A capping layer 52, such as silicon nitride or silicon oxynitride, is formed on dielectric layer 51 and Cu line 50.

A low-k dielectric layer 53 is deposited over dielectric layer 51 on capping layer 52 and an optional middle etch stop layer 54, such as silicon oxide, silicon nitride or silicon oxynitride, is formed on dielectric layer of 53, and a second or upper low-k dielectric layer of 55 formed on middle etch stop layer 54. The dual damascene opening is formed by conventional photolithographic and etching techniques, such as a trench first via last or via first trench last technique. The dual damascene opening is lined with a barrier layer 56, such as Ta and/or TaN, followed by depositing a seedlayer 57. Cu 58 is then deposited, as by electroplating or electroless plating, to fill the dual damascene opening and form an overburden (not shown). Subsequently, CMP is conducted so that the upper surface of the deposited Cu 58 is substantially co-planar with the upper surface dielectric layer 55. The resulting filled dual damascene opening comprises Cu via 59A connected to Cu line 59B. The wafer is then placed in the chamber and processed in accordance with embodiments of the present invention, i.e., plasma treatment with $NH_3$ diluted with $N_2$, discontinuing plasma treatment, evacuating the chamber, and then depositing a silicon carbide capping layer 60, having a low dielectric constant of about 5.0, by PECVD.

Advantageously, the inventive methodology enables fabrication of semiconductor devices with significantly reduced electromigration failures, particular electromigration failures stemming from diffusion along the Cu/capping layer, and an increase in control speed by depositing a silicon carbide capping layer having a low dielectric constant (k) of about 4.5 to about 5.5, after pumping out the chamber subsequent to plasma treatment in $NH_3$ diluted with $NH_2$. Advantageously, the interface between the Cu interconnect and silicon carbide capping layer is substantially free of contamination and reaction productions which would otherwise adversely affect adhesion therebetween, and adversely impact electromigration resistance, thereby improving the accuracy and reliability of interconnects for subsequent metallization levels and reducing electromigration failures.

The present invention enables the formation of extremely reliable capped Cu and/or Cu alloy interconnect members by significantly reducing electromigration failures, as from diffusion along the Cu/silicon carbide interface. In addition, the inventive methodology significantly reduces surface-contamination and reaction products at the interface between a plasma treated copper surface and silicon carbide capping layer deposited thereon, thereby enhancing the adhesion of the capping layer and reducing electromigration failures. In addition, the present invention enables a significant reduction in hillock formation and, hence, a significant increase in electromigration resistance. Consequently, the present invention advantageously reduces capping layer peeling, reduces copper diffusion, enhances, electromigration resistance, improves device reliability, improves within wafer and wafer-to-wafer uniformity, increase control speed, increases production throughput and reduces manufacturing costs.

The present invention enjoys industrial applicability in the fabrication of semiconductor devices having various types of inlaid Cu metallization interconnection patterns. The present invention is particularly applicable to fabricating semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A semiconductor device comprising:
copper (Cu) or a Cu alloy inlaid in a dielectric layer; and
a silicon carbide capping layer on the inlaid Cu or Cu alloy, the silicon carbide capping layer having a dielectric constant of about 4.5 to about 5.5.

2. The semiconductor device according to claim 1, wherein the silicon carbide capping layer has a thickness of about 200 Å to about 800 Å.

3. The semiconductor device according to claim 1, wherein inlaid Cu or Cu alloy is a dual damascene structure comprising a Cu or Cu alloy line in contact with an underlying Cu or Cu alloy via formed in a dielectric layer.

4. The method semiconductor device according to claim 3, wherein the dielectric layer comprises a dielectric material having a dielectric constant less than about 3.9.

5. The semiconductor device according to claim 1, wherein the silicon carbide capping layer is deposited by plasma enhanced chemical vapor deposition (PECVD).

6. The semiconductor device according to claim 5, wherein the silicon carbide layer is deposited at:
a trimethylsilane (TMS) flow rate of about 60 to about 260 sccm;
an ammonia ($NH_3$) flow rate of about 225 to about 425 sccm; and
a helium (He) flow rate of about 100 to about 700 sccm.

7. The semiconductor device according to claim 6, wherein the silicon carbide layer is deposited at:
a temperature of about 300° C. to about 400° C.;
a pressure of about 2 to about 5 Torr; and
an RF power of about 100 to about 500 watts.

8. The semiconductor device according to claim 5, wherein the exposed surface of the inlaid Cu or Cu alloy is treated with a plasma containing ammonia ($NH_3$) heavily diluted with nitogen ($N_2$) to remove oxide therefore before depositing the silicon nitride layer by PECVD.

* * * * *

UNITED STATES PATENT AND TRADEMARK OFFICE
CERTIFICATE OF CORRECTION

PATENT NO.    : 6,989,601 B1
DATED         : January 24, 2006
INVENTOR(S)   : Minh van Ngo et al.

It is certified that error appears in the above-identified patent and that said Letters Patent is hereby corrected as shown below:

<u>Column 9,</u>
Line 14, delete "method".

Signed and Sealed this

Eighteenth Day of April, 2006

JON W. DUDAS
*Director of the United States Patent and Trademark Office*